United States Patent
Linn et al.

(10) Patent No.: US 12,097,695 B2
(45) Date of Patent: *Sep. 24, 2024

(54) ACCESSING REGISTERS OF FLUID EJECTION DEVICES

(71) Applicant: Hewlett-Packard Development Company, L.P., Spring, TX (US)

(72) Inventors: Scott A. Linn, Corvallis, OR (US); James Michael Gardner, Corvallis, OR (US); Michael W. Cumbie, Corvallis, OR (US)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/225,023

(22) Filed: Jul. 21, 2023

(65) Prior Publication Data
US 2023/0356525 A1 Nov. 9, 2023

Related U.S. Application Data

(63) Continuation of application No. 16/768,046, filed as application No. PCT/US2019/016729 on Feb. 6, 2019, now Pat. No. 11,760,085.

(51) Int. Cl.
B41J 29/38 (2006.01)
B41J 2/045 (2006.01)

(52) U.S. Cl.
CPC ....... B41J 2/04541 (2013.01); B41J 2/04586 (2013.01)

(58) Field of Classification Search
CPC . B41J 2/04541; B41J 2/04586; B41J 2/04588
See application file for complete search history.

(56) References Cited

U.S. PATENT DOCUMENTS

| | | |
|---|---|---|
| 6,196,670 B1 | 3/2001 | Saruta |
| 6,398,332 B1 | 6/2002 | Silverbrook et al. |
| 6,439,697 B1 | 8/2002 | Axtell et al. |
| 6,476,928 B1 | 11/2002 | Barbour et al. |
| 6,487,123 B1 | 11/2002 | Takagi |
| 6,540,333 B2 | 4/2003 | Axtell et al. |
| 6,594,185 B1 | 7/2003 | Takagi |
| 8,025,355 B2 | 9/2011 | Silverbrook |
| 11,760,085 B2 | 9/2023 | Linn et al. |
| 2002/0118235 A1 | 8/2002 | Narazaki et al. |
| 2002/0126168 A1 | 9/2002 | Anderson |
| 2016/0009080 A1 | 1/2016 | Akune |
| 2018/0050538 A1 | 2/2018 | Dipert et al. |

(Continued)

FOREIGN PATENT DOCUMENTS

| | | |
|---|---|---|
| CN | 1513670 A | 7/2004 |
| CN | 101971134 A | 2/2011 |

(Continued)

Primary Examiner — Lam S Nguyen
(74) Attorney, Agent, or Firm — Foley & Lardner LLP

(57) ABSTRACT

An integrated circuit to drive a plurality of fluid actuation devices includes a status register, a plurality of interfaces, and control logic. The plurality of interfaces include a mode interface, a data interface, and a fire interface. The control logic enables reading of the status register in response to a signal on the mode interface transitioning to logic high with a logic high signal on the data interface, and transitioning a signal on the fire interface to logic high with the signal on the single data interface floating.

19 Claims, 8 Drawing Sheets

(56) References Cited

U.S. PATENT DOCUMENTS

2018/0050901 A1    2/2018   Neo et al.
2018/0147839 A1    5/2018   Ge et al.

FOREIGN PATENT DOCUMENTS

| | | |
|---|---|---|
| CN | 107073940 A | 8/2017 |
| EP | 1029675 A2 | 8/2000 |
| JP | 06-037811 A | 2/1994 |
| JP | 2000-238247 A | 9/2000 |
| JP | 2001-063056 A | 3/2001 |
| JP | 2002-254621 A | 9/2002 |
| JP | 2003-341063 A | 12/2003 |
| JP | 2005-131875 A | 5/2005 |
| JP | 2016-016660 A | 2/2016 |
| KR | 10-2001-0049896 A | 6/2001 |
| WO | 2018/190861 A1 | 10/2018 |

ACCESSING REGISTERS OF FLUID EJECTION DEVICES

CROSS-REFERENCE TO RELATED APPLICATIONS

This application is a Continuation of U.S. patent application Ser. No. 16/768,046, filed May 28, 2020, entitled "ACCESSING REGISTERS OF FLUID EJECTION DEVICES", which is a U.S. National Stage Application of PCT/US2019/016729, filed Feb. 6, 2019, entitled "ACCESSING REGISTERS OF FLUID EJECTION DEVICES."

BACKGROUND

An inkjet printing system, as one example of a fluid ejection system, may include a printhead, an ink supply which supplies liquid ink to the printhead, and an electronic controller which controls the printhead. The printhead, as one example of a fluid ejection device, ejects drops of ink through a plurality of nozzles or orifices and toward a print medium, such as a sheet of paper, so as to print onto the print medium. In some examples, the orifices are arranged in at least one column or array such that properly sequenced ejection of ink from the orifices causes characters or other images to be printed upon the print medium as the printhead and the print medium are moved relative to each other.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

In certain examples, it may be desirable to reduce the width of a semiconductor die or device including fluid actuation devices (e.g., a fluid ejection die) to reduce costs and improve manufacturability. As the width of a fluid ejection die is reduced, there is less die area available for circuitry. Accordingly, disclosed herein is a device to enable fluid ejection that may include a configuration register (e.g., a write only configuration register) and/or a status register (e.g., a read only status register). The configuration register may be enabled for writing in response to a signal on a mode contact pad transitioning to logic high with a logic high signal on a data contact pad. With the configuration register enabled, data may be written to the configuration register via the data contact pad. The status register may be enabled for reading in response to both a signal on a mode contact pad transitioning to logic high with a logic high signal on a data contact pad and transitioning a signal on a fire contact pad to logic high with the signal on the data contact pad floating. With the status register enabled for reading, data may be read out from the status register via the data contact pad.

As used herein a "logic high" signal is a logic "1" or "on" signal or a signal having a voltage about equal to the logic power supplied to an integrated circuit (e.g., between about 1.8 V and 15 V, such as 5.6 V). As used herein a "logic low" signal is a logic "0" or "off" signal or a signal having a voltage about equal to a logic power ground return for the logic power supplied to the integrated circuit (e.g., about 0 V).

Figure 1A:
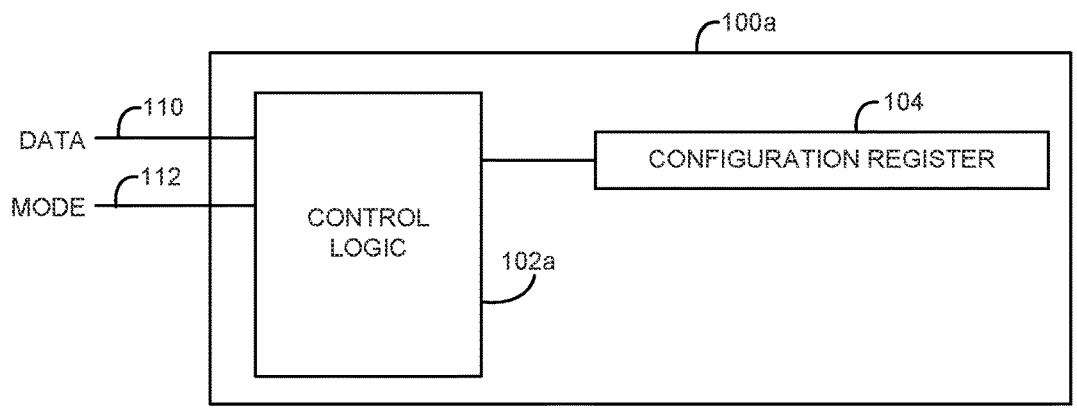
FIG. 1A is a block diagram illustrating one example of an integrated circuit to drive a plurality of fluid actuation devices.

FIG. 1A is a block diagram illustrating one example of an integrated circuit 100a to drive a plurality of fluid actuation devices. In one example, integrated circuit 100a is part of a fluid ejection die, which will be described below with reference to FIGS. 6A and 6B. Integrated circuit 100a includes control logic 102a, a configuration register 104, and a plurality of interfaces including a data interface 110 and a mode interface 112. Data interface 110 and mode interface 112 are electrically coupled to control logic 102. Control logic 102a is electrically coupled to configuration register 104. Control logic 102a enables writing to the configuration register 104 in response to a signal on the mode interface 112 transitioning to logic high with a logic high signal on the data interface 110. In one example, control logic 102a disables writing to the configuration register 104 in response to a logic low signal on the mode interface 112. Configuration register 104 may receive serial data from the data interface 110 with the configuration register 104 enabled for writing.

Control logic 102a may include a microprocessor, an application-specific integrated circuit (ASIC), or other suitable logic circuitry for controlling the operation of integrated circuit 100a. Configuration register 104 may be a memory device (e.g., nonvolatile memory, shift register, etc.) and may include any suitable number of bits (e.g., 4 bits to 24 bits, such as 12 bits). Configuration register 104 may store configuration data for testing integrated circuit 100a, detecting cracks within a substrate of integrated circuit 100a, enabling watchdogs of integrated circuit 100a, setting analog delays of integrated circuit 100a, enabling access to memory of integrated circuit 100a, validating operations of integrated circuit 100a, or for configuring other functions of integrated circuit 100a. Each of the plurality of interfaces including the data interface 110 and the mode interface 112 may be a contact pad, a pin, a bump, a wire, or another suitable electrical interface for transmitting signals to control logic 102a and/or for receiving signals from control logic 102a. Each of the plurality of interfaces may be electrically coupled to a fluid ejection system (e.g., a printer).

Figure 1B:
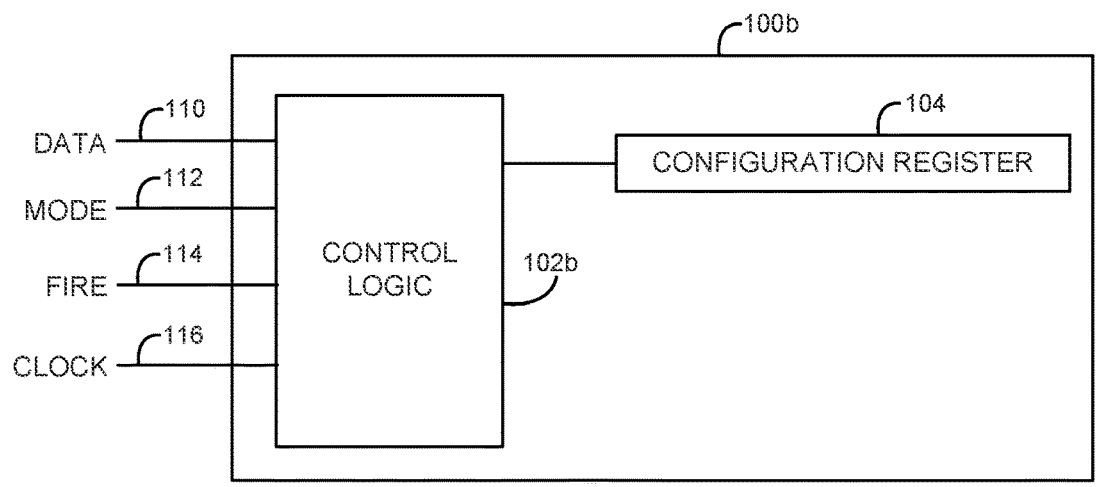
FIG. 1B is a block diagram illustrating another example of an integrated circuit to drive a plurality of fluid actuation devices.

FIG. 1B is a block diagram illustrating another example of an integrated circuit 100b to drive a plurality of fluid actuation devices. In one example, integrated circuit 100b is part of a fluid ejection die, which will be described below with reference to FIGS. 6A and 6B. Integrated circuit 100b is similar to integrated circuit 100a previously described and illustrated with reference to FIG. 1A and includes control logic 102b, a configuration register 104, and a plurality of interfaces including a data interface 110, a mode interface 112, a fire interface 114, and a clock interface 116. Data interface 110, mode interface 112, fire interface 114, and clock interface 116 are electrically coupled to control logic 102b. Control logic 102b is electrically coupled to configuration register 104.

Control logic 102b enables writing to the configuration register 104 in response to the signal on the mode interface 110 transitioning to logic high with a logic high signal on the data interface 110 and a logic low signal on the fire interface 114. In one example, control logic 102b disables writing to the configuration register 104 in response to a logic low signal on the mode interface 112. Configuration register 104 may receive serial data from the data interface 110 with the configuration register 104 enabled for writing. In one example, the configuration register 104 may receive the serial data from the data interface 110 aligned with a clock signal from the clock interface 116.

Control logic 102b may include a microprocessor, an ASIC, or other suitable logic circuitry for controlling the operation of integrated circuit 100b. Configuration register 104 may store configuration data for testing integrated circuit 100b, detecting cracks within a substrate of integrated circuit 100b, enabling watchdogs of integrated circuit 100b, setting analog delays of integrated circuit 100b, enabling access to memory of integrated circuit 100b, validating operations of integrated circuit 100b, or for configuring other functions of integrated circuit 100b. Each of the plurality of interfaces including the data interface 110, the mode interface 112, the fire interface 114, and the clock interface 116 may be a contact pad, a pin, a bump, a wire, or another suitable electrical interface for transmitting signals to control logic 102b and/or for receiving signals from control logic 102b. Each of the plurality of interfaces may be electrically coupled to a fluid ejection system (e.g., a printer).

Figure 2:
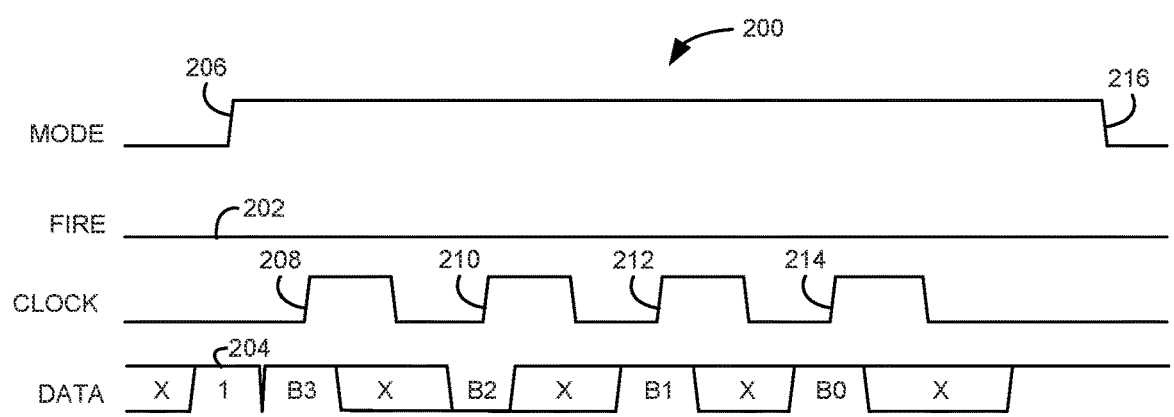
FIG. 2 is a timing diagram illustrating one example for accessing a configuration register of an integrated circuit.

FIG. 2 is a timing diagram 200 illustrating one example for accessing a configuration register of an integrated circuit, such as configuration register 104 of integrated circuit 100b of FIG. 1B. Timing diagram 200 includes a mode signal on a mode interface (e.g., mode interface 112), a fire signal on a fire interface (e.g., fire interface 114), a clock signal on a clock interface (e.g., clock interface 116), and a data signal on a data interface (e.g., data interface 110). With a logic low fire signal as indicated at 202 and a logic high data signal as indicated at 204, the configuration register is enabled for writing in response to the mode signal transitioning from a logic low to a logic high as indicated at 206.

With the configuration register enabled for writing, a data stream provided by the data signal may be written to the configuration register. In this example, a four bit data stream (i.e., bits B3, B2, B1, and B0) is written to the configuration register. In other examples, any suitable number of bits may be written to the configuration register. Each bit of the data stream may be written to the configuration register in response to the clock signal. For example, the rising edge of the clock signal as indicated at 208 may write (e.g., latch) the B3 bit into the configuration register. Likewise, the rising edges of the clock signal as indicated at 210, 212, and 214 may write (e.g., latch) bits B2, B1, and B0, respectively, into the configuration register. In other examples, each bit of the data stream may be written to the configuration register in response to each corresponding falling edge of the clock signal or in response to the rising and falling edges of the clock signal. In one example where the configuration register is a shift register, the data stream may be written to the configuration register by shifting the data stream into the configuration register such that previous and/or extra bits are shifted out of the configuration register. Writing to the configuration register may be disabled by transitioning the mode signal back to a logic low as indicated at 216.

Figure 3A:
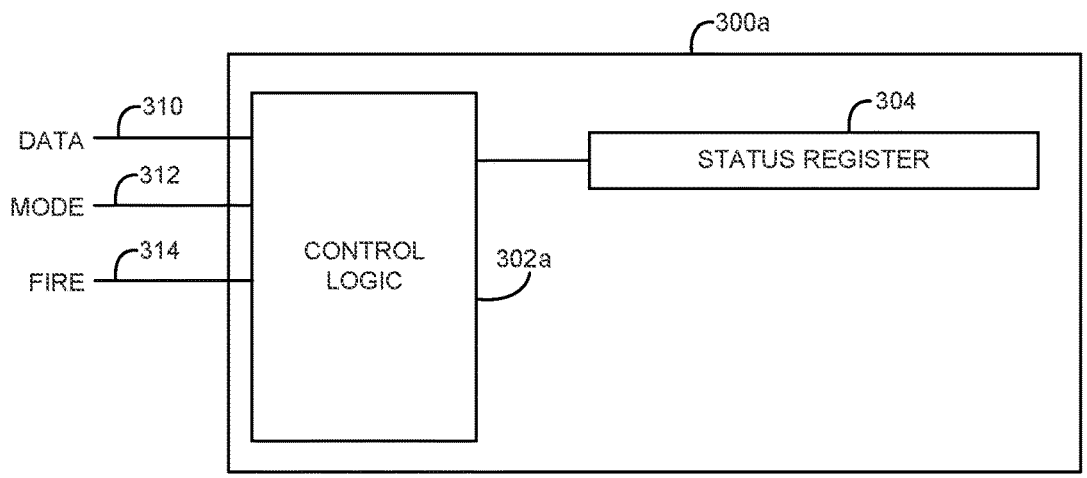
FIG. 3A is a block diagram illustrating another example of an integrated circuit to drive a plurality of fluid actuation devices.

FIG. 3A is a block diagram illustrating another example of an integrated circuit 300a to drive a plurality of fluid actuation devices. In one example, integrated circuit 300a is part of a fluid ejection die, which will be described below with reference to FIGS. 6A and 6B. Integrated circuit 300a includes control logic 302a, a status register 304, and a plurality of interfaces including a data interface 310, a mode interface 312, and a fire interface 314. Data interface 310, mode interface 312, and fire interface 314 are electrically coupled to control logic 302a. Control logic 302a is electrically coupled to status register 304.

Control logic 302a enables reading of the status register 304 in response to both a signal on the mode interface 312 transitioning to logic high with a logic high signal on the data interface 310 and transitioning a signal on the fire interface 314 to logic high with the signal on the data interface 310 floating. In one example, control logic 302a disables reading of the status register 304 in response to a logic low signal on the mode interface 312. In another example, control logic 302a disables reading of the status register 304 in response to a logic low signal on the fire interface 314. The status register 304 may output serial data to the data interface 310 with the status register 304 enabled for reading.

Control logic 302a may include a microprocessor, an ASIC, or other suitable logic circuitry for controlling the operation of integrated circuit 300a. Status register 304 may be a memory device (e.g., nonvolatile memory, shift register, etc.) and may include any suitable number of bits (e.g., 1 bit to 12 bits, such as 5 bits). Status register 304 may store status data such as a revision status for integrated circuit 300a, a watchdog status of integrated circuit 300a, or other suitable status data for integrated circuit 300a. Each of the plurality of interfaces including the data interface 310, the mode interface 312, and the fire interface 314 may be a contact pad, a pin, a bump, a wire, or another suitable electrical interface for transmitting signals to control logic 302a and/or for receiving signals from control logic 302a. Each of the plurality of interfaces may be electrically coupled to a fluid ejection system (e.g., a printer).

Figure 3B:
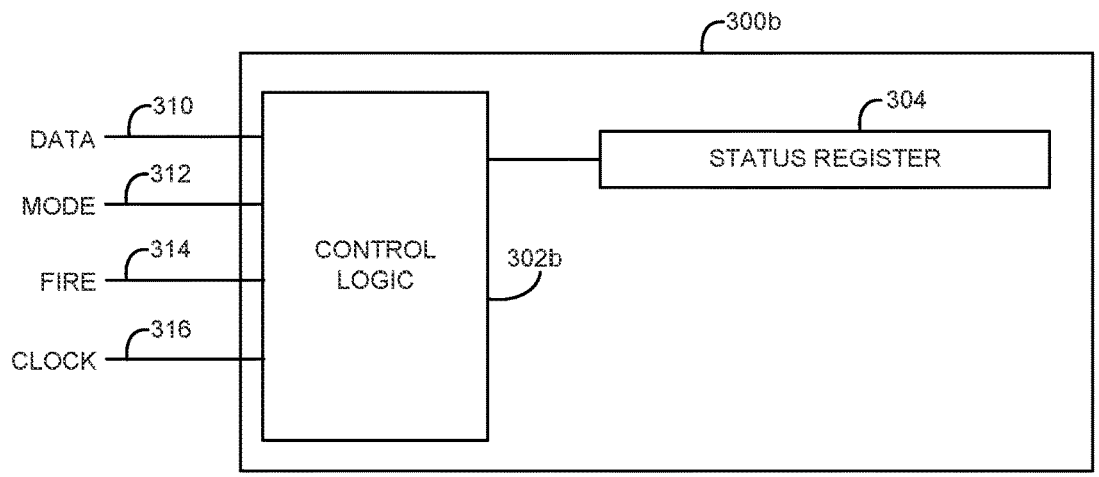
FIG. 3B is a block diagram illustrating another example of an integrated circuit to drive a plurality of fluid actuation devices.

FIG. 3B is a block diagram illustrating another example of an integrated circuit 300b to drive a plurality of fluid actuation devices. In one example, integrated circuit 300b is part of a fluid ejection die, which will be described below with reference to FIGS. 6A and 6B. Integrated circuit 300b is similar to integrated circuit 300a previously described and illustrated with reference to FIG. 3A and includes control logic 302*b*, a status register 304, and a plurality of interfaces including a data interface 310, a mode interface 312, a fire interface 314, and a clock interface 316. Data interface 310, mode interface 312, fire interface 314, and clock interface 316 are electrically coupled to control logic 302*b*. Control logic 302*b* is electrically coupled to status register 304.

Control logic 302*b* enables reading of the status register 304 in response to both a signal on the mode interface 312 transitioning to logic high with a logic high signal on the data interface 310 and transitioning a signal on the fire interface 314 to logic high with the signal on the data interface 310 floating. In one example, control logic 302*b* disables reading of the status register 304 in response to a logic low signal on the mode interface 312. In another example, control logic 302*b* disables reading of the status register 304 in response to a logic low signal on the fire interface 314. The status register 304 may output serial data to the data interface 310 with the status register 304 enabled for reading. In one example, the status register 304 outputs the serial data to the data interface 310 aligned with a clock signal on the clock interface 316.

Control logic 302*b* may include a microprocessor, an ASIC, or other suitable logic circuitry for controlling the operation of integrated circuit 300*b*. Status register 304 may store status data such as a revision status for integrated circuit 300*b*, a watchdog status of integrated circuit 300*b*, or other suitable status data for integrated circuit 300*b*. Each of the plurality of interfaces including the data interface 310, the mode interface 312, the fire interface 314, and the clock interface 316 may be a contact pad, a pin, a bump, a wire, or another suitable electrical interface for transmitting signals to control logic 302*b* and/or for receiving signals from control logic 302*b*. Each of the plurality of interfaces may be electrically coupled to a fluid ejection system (e.g., a printer).

Figure 4:
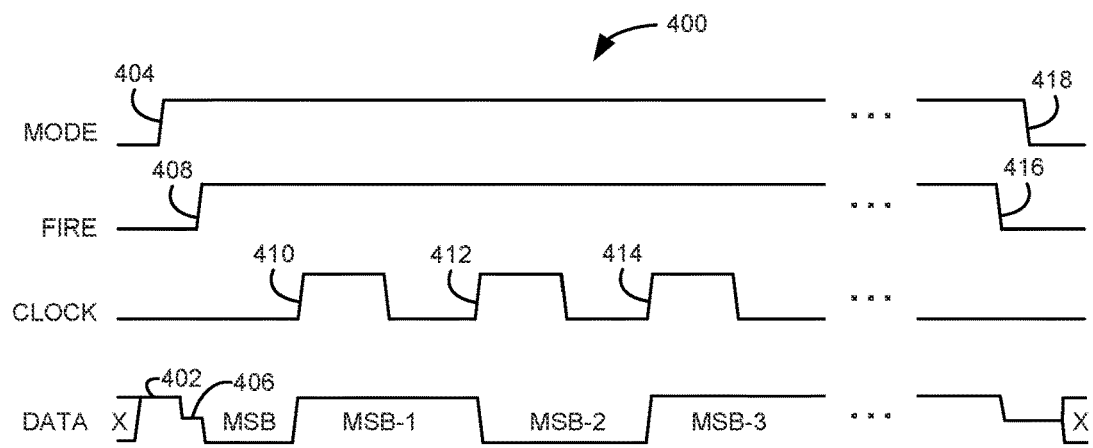
FIG. 4 is a timing diagram illustrating one example for accessing a status register of an integrated circuit.

FIG. 4 is a timing diagram 400 illustrating one example for accessing a status register of an integrated circuit, such as status register 304 of integrated circuit 300*b* of FIG. 3B. Timing diagram 400 includes a mode signal on a mode interface (e.g., mode interface 312), a fire signal on a fire interface (e.g., fire interface 314), a clock signal on a clock interface (e.g., clock interface 316), and a data signal on a data interface (e.g., data interface 310). With a logic high data signal as indicated at 402, the mode signal is transitioned from a logic low to a logic high as indicated at 404. The data signal is then transitioned to floating as indicated at 406. With the data signal floating, the fire signal is transitioned from a logic low to a logic high as indicated at 408 to enable reading of the status register.

With the status register enabled for reading, the status register may output a data stream via the data signal. In this example, the data stream (i.e., bits MSB, MSB-1, MSB-2, MSB-3, etc.) is read from the status register. Any suitable number of bits may be read from the status register. Each bit of the data stream may be read from the status register in response to the clock signal. For example, the MSB bit may be read from the status register in response to enabling the status register for reading. The rising edge of the clock signal as indicated at 410 may output the MSB-1 bit via the data signal. Likewise, the rising edges of the clock signal as indicated at 412, 414, etc. may output bits MSB-2, MSB-3, etc., respectively, via the data signal. In other examples, each bit of the data stream may be output from the status register in response to each corresponding falling edge of the clock signal or in response to the rising and falling edges of the clock signal. Reading of the status register may be disabled by transitioning the fire signal back to a logic low as indicated at 416 and/or by transitioning the mode signal back to a logic low as indicated at 418.

Figure 5:
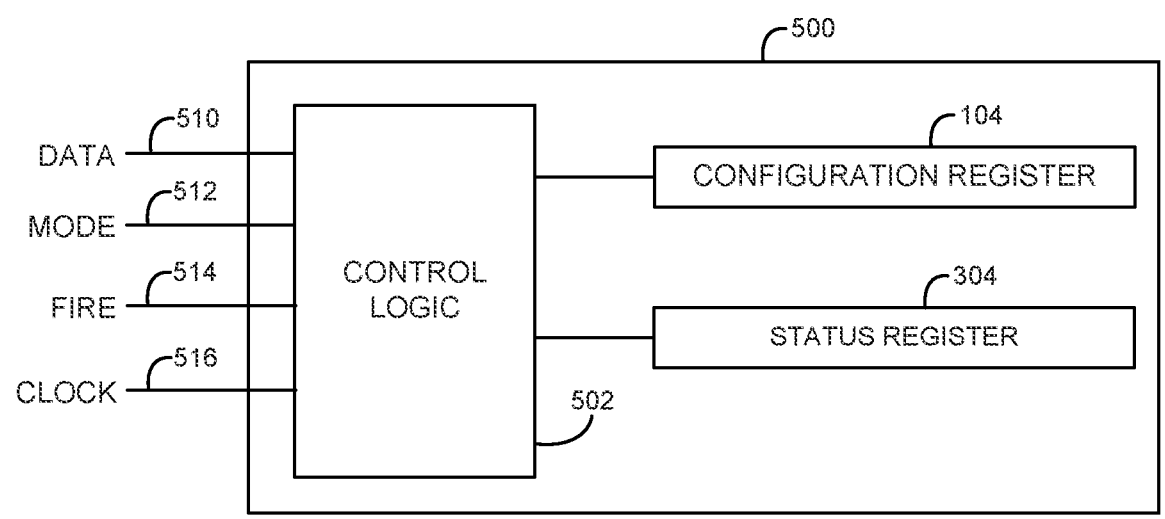
FIG. 5 is a block diagram illustrating another example of an integrated circuit to drive a plurality of fluid actuation devices.

FIG. 5 is a block diagram illustrating another example of an integrated circuit 500 to drive a plurality of fluid actuation devices. In one example, integrated circuit 500 is part of a fluid ejection die, which will be described below with reference to FIGS. 6A and 6B. Integrated circuit 500 may include the features of integrated circuit 100*a* (FIG. 1A) or 100*b* (FIG. 1B) and the features of integrated circuit 300*a* (FIG. 3A) or 300*b* (FIG. 3B). Integrated circuit 500 includes control logic 502, a configuration register 104, a status register 304, and a plurality of interfaces including a data interface 510, a mode interface 512, a fire interface 514, and a clock interface 516. Data interface 510, mode interface 512, fire interface 514, and clock interface 516 are electrically coupled to control logic 502. Control logic 502 is electrically coupled to configuration register 104 and status register 304.

Control logic 502 enables writing to the configuration register 104 in response to the signal on the mode interface 510 transitioning to logic high with a logic high signal on the data interface 510 and a logic low signal on the fire interface 514. In one example, control logic 502 disables writing to the configuration register 104 in response to a logic low signal on the mode interface 512. Configuration register 104 may receive serial data from the data interface 510 with the configuration register 104 enabled for writing. In one example, the configuration register 104 may receive the serial data from the data interface 510 aligned with a clock signal from the clock interface 516.

In addition, control logic 502 enables reading of the status register 304 in response to both a signal on the mode interface 512 transitioning to logic high with a logic high signal on the data interface 510 and transitioning a signal on the fire interface 514 to logic high with the signal on the data interface 510 floating. In one example, control logic 502 disables reading of the status register 304 in response to a logic low signal on the mode interface 512. In another example, control logic 502 disables reading of the status register 304 in response to a logic low signal on the fire interface 514. The status register 304 may output serial data to the data interface 510 with the status register 304 enabled for reading. In one example, the status register 304 outputs the serial data to the data interface 510 aligned with a clock signal on the clock interface 516.

Control logic 502 may include a microprocessor, an ASIC, or other suitable logic circuitry for controlling the operation of integrated circuit 500. The configuration register 104 and the status register 304 were previously described above with reference to FIGS. 1A-1B and 3A-3B, respectively. Each of the plurality of interfaces including the data interface 510, the mode interface 512, the fire interface 514, and the clock interface 516 may be a contact pad, a pin, a bump, a wire, or another suitable electrical interface for transmitting signals to control logic 502 and/or for receiving signals from control logic 502. Each of the plurality of interfaces may be electrically coupled to a fluid ejection system (e.g., a printer).

Figure 6A:
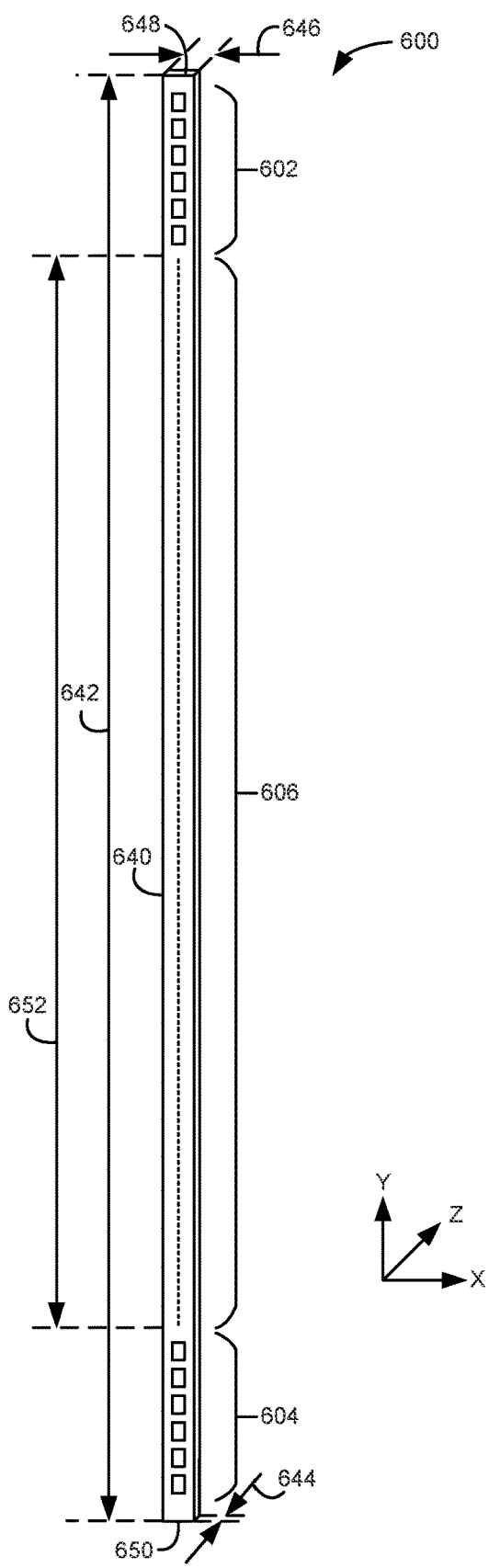
FIGS. 6A and 6B illustrate one example of a fluid ejection die.
Figure 6B:
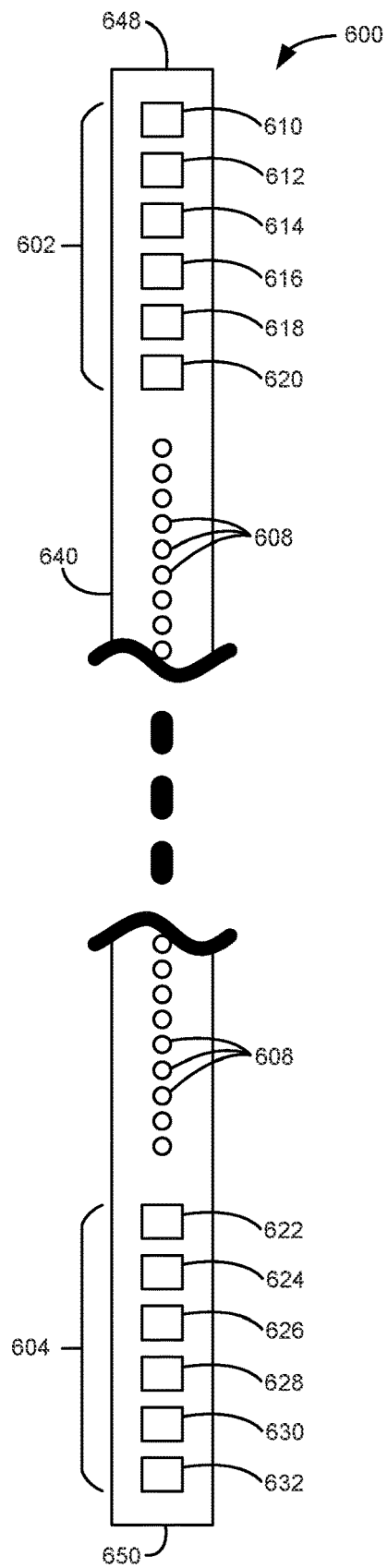

FIG. 6A illustrates one example of a fluid ejection die 600 and FIG. 6B illustrates an enlarged view of the ends of fluid ejection die 600. Die 600 includes a first column 602 of contact pads, a second column 604 of contact pads, and a column 606 of fluid actuation devices 608. The second column 604 of contact pads is aligned with the first column 602 of contact pads and at a distance (i.e., along the Y axis) from the first column 602 of contact pads. The column 606 of fluid actuation devices 608 is disposed longitudinally to the first column 602 of contact pads and the second column 604 of contact pads. The column 606 of fluid actuation devices 608 is also arranged between the first column 602 of contact pads and the second column 604 of contact pads. In one example, fluid actuation devices 608 are nozzles or fluidic pumps to eject fluid drops.

In one example, the first column 602 of contact pads includes six contact pads. The first column 602 of contact pads may include the following contact pads in order: a data contact pad 610, a clock contact pad 612, a logic power ground return contact pad 614, a multipurpose input/output contact pad 616, a first high voltage power supply contact pad 618, and a first high voltage power ground return contact pad 620. Therefore, the first column 602 of contact pads includes the data contact pad 610 at the top of the first column 602, the first high voltage power ground return contact pad 620 at the bottom of the first column 602, and the first high voltage power supply contact pad 618 directly above the first high voltage power ground return contact pad 620. While contact pads 610, 612, 614, 616, 618, and 620 are illustrated in a particular order, in other examples the contact pads may be arranged in a different order.

In one example, the second column 604 of contact pads includes six contact pads. The second column 604 of contact pads may include the following contact pads in order: a second high voltage power ground return contact pad 622, a second high voltage power supply contact pad 624, a logic reset contact pad 626, a logic power supply contact pad 628, a mode contact pad 630, and a fire contact pad 632. Therefore, the second column 604 of contact pads includes the second high voltage power ground return contact pad 622 at the top of the second column 604, the second high voltage power supply contact pad 624 directly below the second high voltage power ground return contact pad 622, and the fire contact pad 632 at the bottom of the second column 604. While contact pads 622, 624, 626, 628, 630, and 632 are illustrated in a particular order, in other examples the contact pads may be arranged in a different order.

In one example, data contact pad 610 may provide data interface 110 of FIG. 1A or 1B, data interface 310 of FIG. 3A or 3B, or data interface 510 of FIG. 5. Mode contact pad 630 may provide mode interface 112 of FIG. 1A or 1B, mode interface 312 of FIG. 3A or 3B, or mode interface 512 of FIG. 5. Fire contact pad 632 may provide fire interface 114 of FIG. 1B, fire interface 314 of FIG. 3A or 3B, or fire interface 514 of FIG. 5. Clock contact pad 612 may provide clock interface 116 of FIG. 1B, clock interface 316 of FIG. 3B, or clock interface 516 of FIG. 5.

Data contact pad 610 may be used to input serial data to die 600 for selecting fluid actuation devices, memory bits, thermal sensors, configuration modes (e.g. via a configuration register 104), etc. Data contact pad 610 may also be used to output serial data from die 600 for reading memory bits, configuration modes, status information (e.g., via a status register 304), etc. Clock contact pad 612 may be used to input a clock signal to die 600 to shift serial data on data contact pad 610 into the die or to shift serial data out of the die to data contact pad 610. Logic power ground return contact pad 614 provides a ground return path for logic power (e.g., about 0 V) supplied to die 600. In one example, logic power ground return contact pad 614 is electrically coupled to the semiconductor (e.g., silicon) substrate 640 of die 600. Multipurpose input/output contact pad 616 may be used for analog sensing and/or digital test modes of die 600.

First high voltage power supply contact pad 618 and second high voltage power supply contact pad 624 may be used to supply high voltage (e.g., about 32 V) to die 600. First high voltage power ground return contact pad 620 and second high voltage power ground return contact pad 622 may be used to provide a power ground return (e.g., about 0 V) for the high voltage power supply. The high voltage power ground return contact pads 620 and 622 are not directly electrically connected to the semiconductor substrate 640 of die 600. The specific contact pad order with the high voltage power supply contact pads 618 and 624 and the high voltage power ground return contact pads 620 and 622 as the innermost contact pads may improve power delivery to die 600. Having the high voltage power ground return contact pads 620 and 622 at the bottom of the first column 602 and at the top of the second column 604, respectively, may improve reliability for manufacturing and may improve ink shorts protection.

Logic reset contact pad 626 may be used as a logic reset input to control the operating state of die 600. Logic power supply contact pad 628 may be used to supply logic power (e.g., between about 1.8 V and 15 V, such as 5.6 V) to die 600. Mode contact pad 630 may be used as a logic input to control access to enable/disable configuration modes (i.e., functional modes) of die 600. Fire contact pad 632 may be used as a logic input to latch loaded data from data contact pad 610 and to enable fluid actuation devices or memory elements of die 600.

Die 600 includes an elongate substrate 640 having a length 642 (along the Y axis), a thickness 644 (along the Z axis), and a width 646 (along the X axis). In one example, the length 642 is at least twenty times the width 646. The width 646 may be 1 mm or less and the thickness 644 may be less than 500 microns. The fluid actuation devices 608 (e.g., fluid actuation logic) and contact pads 610-632 are provided on the elongate substrate 640 and are arranged along the length 642 of the elongate substrate. Fluid actuation devices 608 have a swath length 652 less than the length 642 of the elongate substrate 640. In one example, the swath length 652 is at least 1.2 cm. The contact pads 610-632 may be electrically coupled to the fluid actuation logic. The first column 602 of contact pads may be arranged near a first longitudinal end 648 of the elongate substrate 640. The second column 604 of contact pads may be arranged near a second longitudinal end 650 of the elongate substrate 640 opposite to the first longitudinal end 648.

Figure 7A:
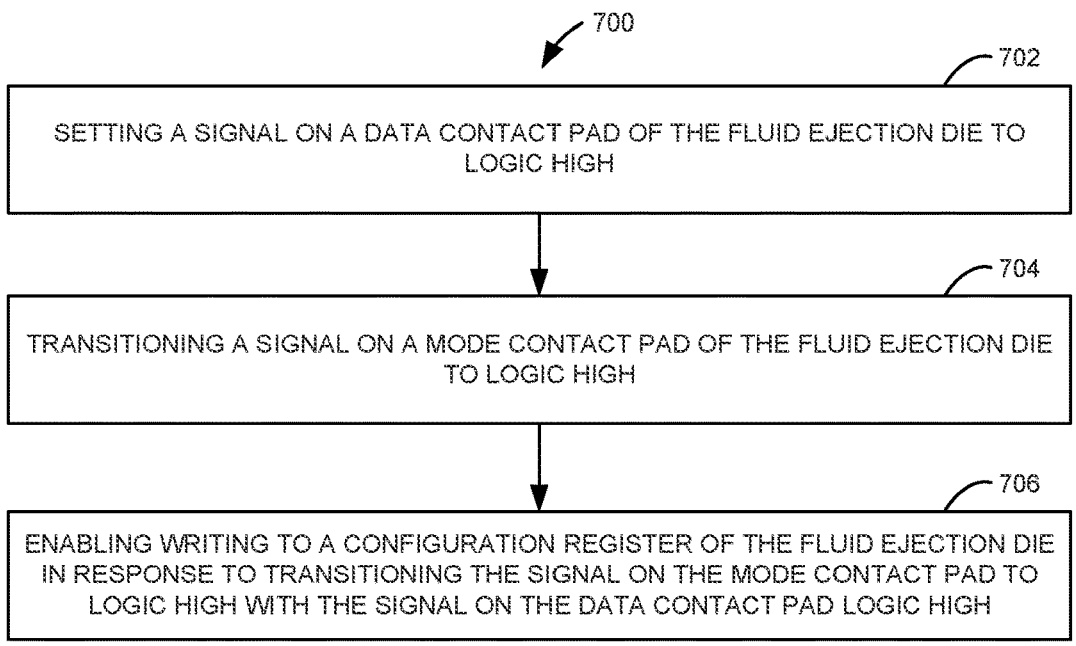
FIGS. 7A-7D are flow diagrams illustrating one example of a method for accessing a fluid ejection die.

FIGS. 7A-7D are flow diagrams illustrating one example of a method 700 for accessing a fluid ejection die. As illustrated in FIG. 7A, at 702 method 700 includes setting a signal on a data contact pad of the fluid ejection die to logic high. At 704, method 700 includes transitioning a signal on a mode contact pad of the fluid ejection die to logic high. At 706, method 700 includes enabling writing to a configuration register of the fluid ejection die in response to transitioning the signal on the mode contact pad to logic high with the signal on the data contact pad logic high.

Figure 7B:
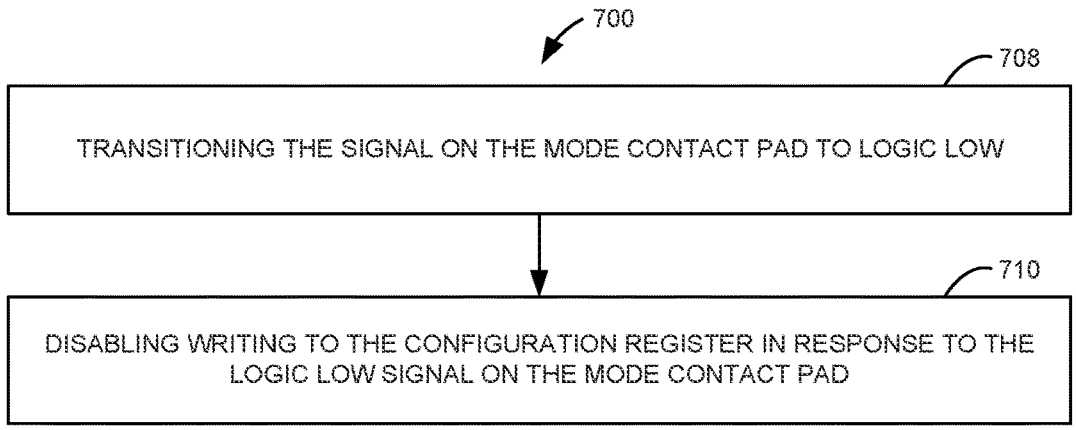
Figure 7C:
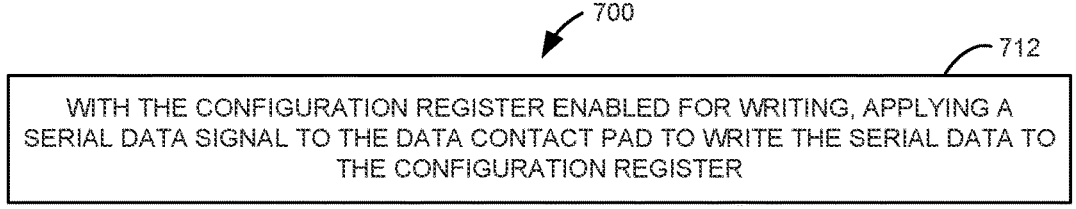
Figure 7D:
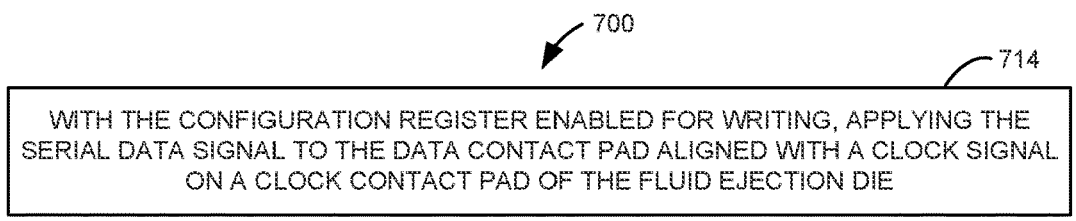

As illustrated in FIG. 7B, at 708 method 700 may also include transitioning the signal on the mode contact pad to logic low. At 710, method 700 may include disabling writing to the configuration register in response to the logic low signal on the mode contact pad. As illustrated in FIG. 7C, at 712 method 700 may also include with the configuration register enabled for writing, applying a serial data signal to the data contact pad to write the serial data to the configuration register. As illustrated in FIG. 7D, at 714 method 700 may also include with the configuration register enabled for writing, applying the serial data signal to the data contact pad aligned with a clock signal on a clock contact pad of the fluid ejection die.

Figure 8A:
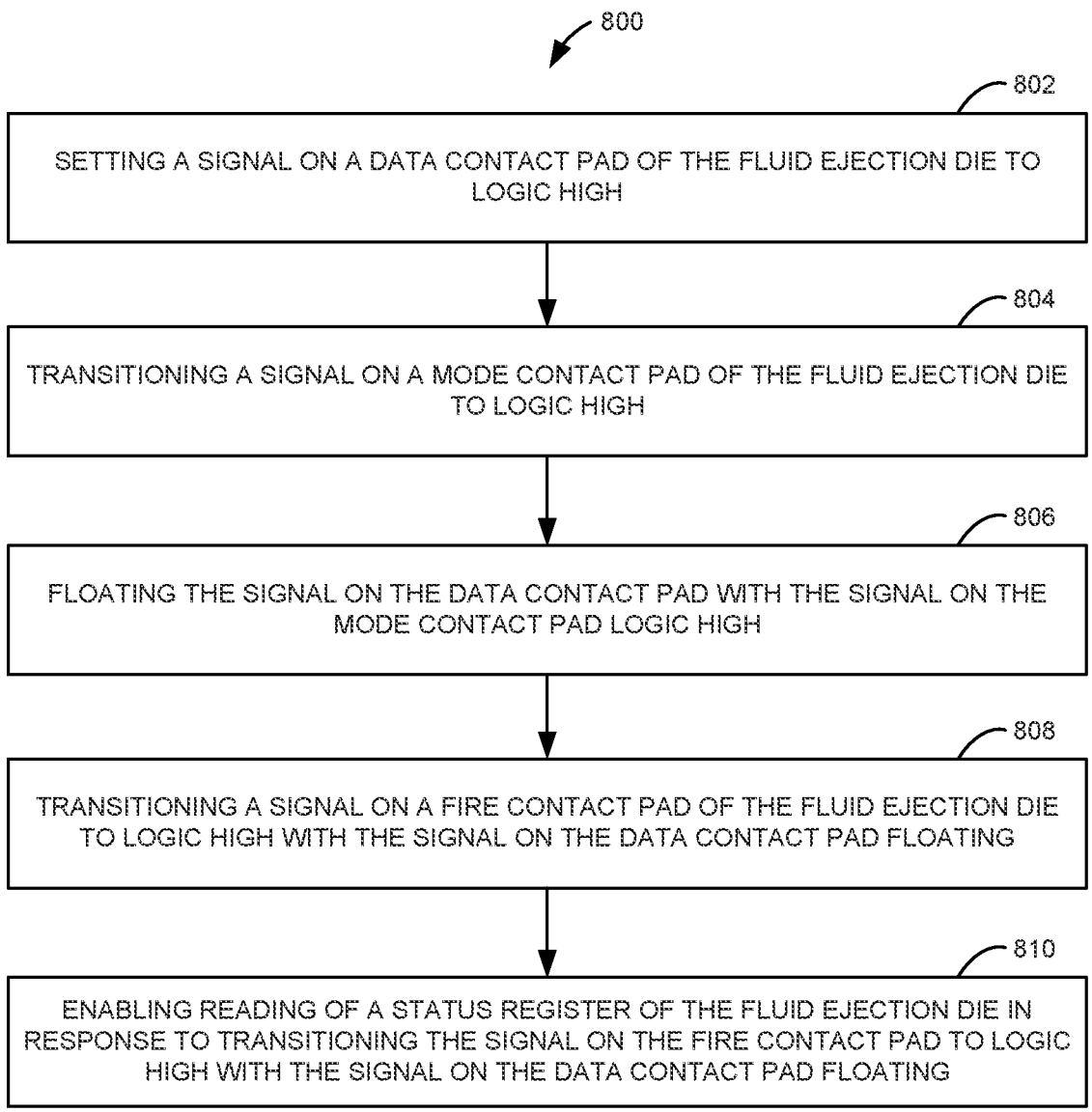
FIGS. 8A-8E are flow diagrams illustrating another example of a method for accessing a fluid ejection die.

FIGS. 8A-8E are flow diagrams illustrating another example of a method 800 for accessing a fluid ejection die. As illustrated in FIG. 8A, at 802 method 800 includes setting a signal on a data contact pad of the fluid ejection die to logic high. At 804, method 800 includes transitioning a signal on a mode contact pad of the fluid ejection die to logic high. At 806, method 800 includes floating the signal on the data contact pad with the signal on the mode contact pad logic high. At 808, method 800 includes transitioning a signal on a fire contact pad of the fluid ejection die to logic high with the signal on the data contact pad floating. At 810, method 800 includes enabling reading of a status register of the fluid ejection die in response to transitioning the signal on the fire contact pad to logic high with the signal on the data contact pad floating.

Figure 8B:
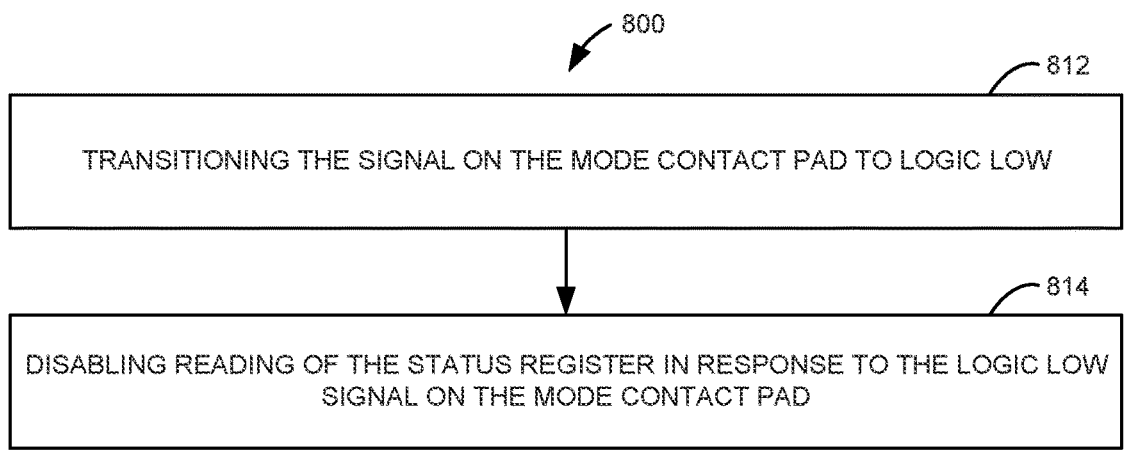
Figure 8C:
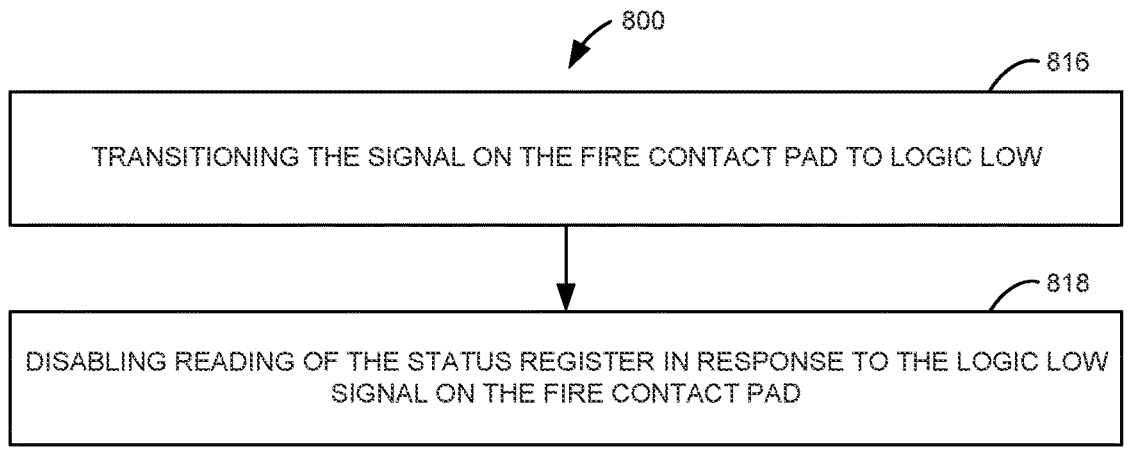
Figure 8D:
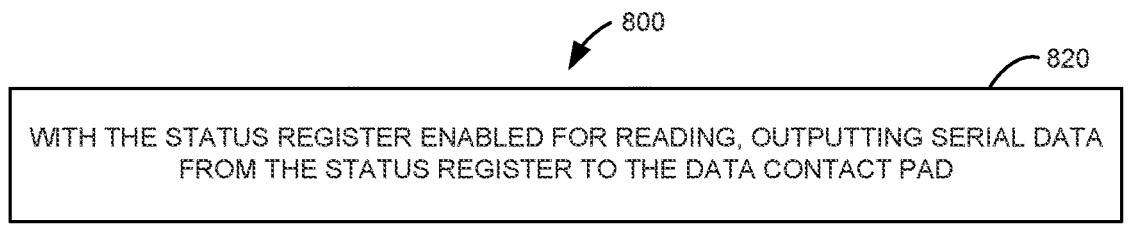
Figure 8E:
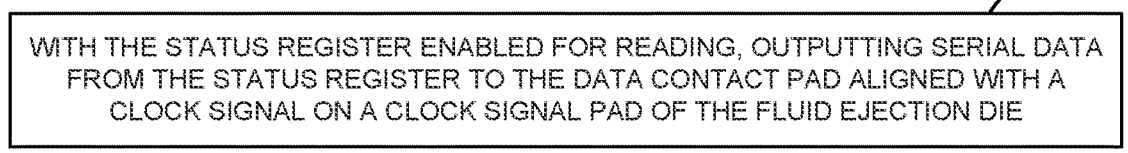

As illustrated in FIG. 8B, at 812 method 800 may also include transitioning the signal on the mode contact pad to logic low. At 814, method 800 may include disabling reading of the status register in response to the logic low signal on the mode contact pad. As illustrated in FIG. 8C, at 816 method 800 may also include transitioning the signal on the fire contact pad to logic low. At 818, method 800 may include disabling reading of the status register in response to the logic low signal on the fire contact pad. As illustrated in FIG. 8D, at 820 method 800 may also include with the status register enabled for reading, outputting serial data from the status register to the data contact pad. As illustrated in FIG. 8E, at 822 method 800 may also include with the status register enabled for reading, outputting serial data from the status register to the data contact pad aligned with a clock signal on a clock signal pad of the fluid ejection die.

Figure 9:
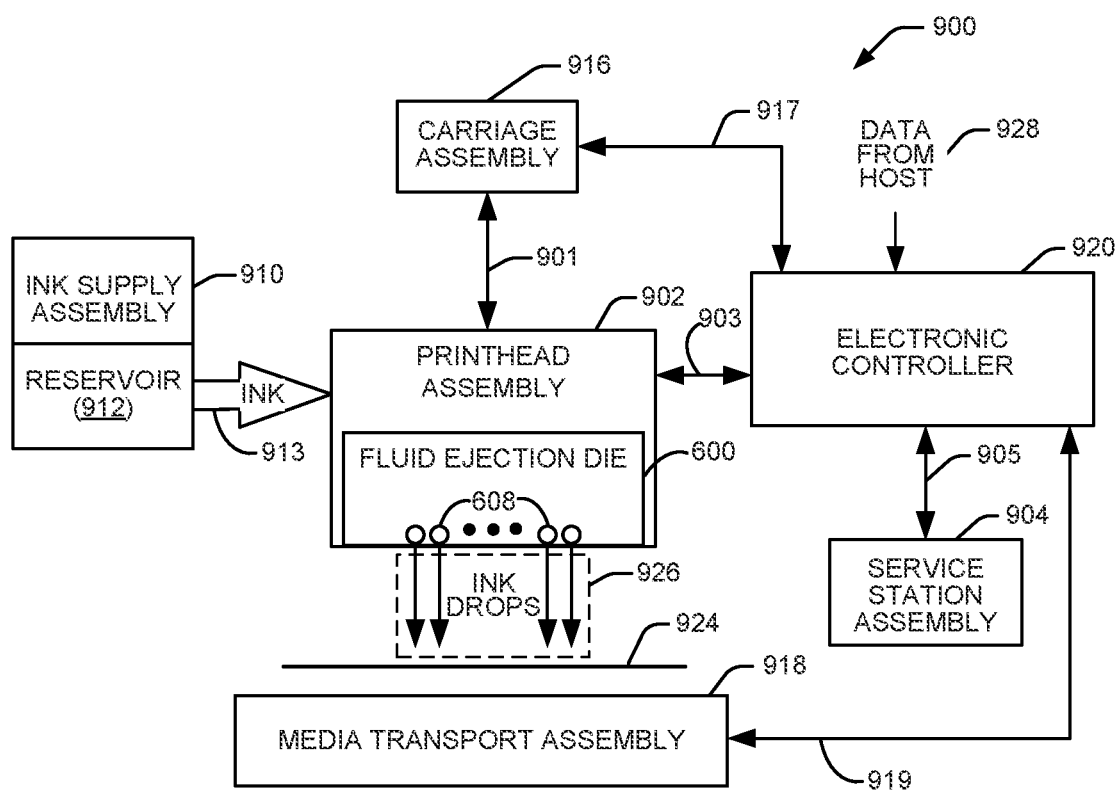
FIG. 9 is a block diagram illustrating one example of a fluid ejection system.

FIG. 9 is a block diagram illustrating one example of a fluid ejection system 900. Fluid ejection system 900 includes a fluid ejection assembly, such as printhead assembly 902, and a fluid supply assembly, such as ink supply assembly 910. In the illustrated example, fluid ejection system 900 also includes a service station assembly 904, a carriage assembly 916, a print media transport assembly 918, and an electronic controller 920. While the following description provides examples of systems and assemblies for fluid handling with regard to ink, the disclosed systems and assemblies are also applicable to the handling of fluids other than ink.

Printhead assembly 902 includes at least one printhead or fluid ejection die 600 previously described and illustrated with reference to FIGS. 6A and 6B, which ejects drops of ink or fluid through a plurality of orifices or nozzles 608. In one example, the drops are directed toward a medium, such as print media 924, so as to print onto print media 924. In one example, print media 924 includes any type of suitable sheet material, such as paper, card stock, transparencies, Mylar, fabric, and the like. In another example, print media 924 includes media for three-dimensional (3D) printing, such as a powder bed, or media for bioprinting and/or drug discovery testing, such as a reservoir or container. In one example, nozzles 608 are arranged in at least one column or array such that properly sequenced ejection of ink from nozzles 608 causes characters, symbols, and/or other graphics or images to be printed upon print media 924 as printhead assembly 902 and print media 924 are moved relative to each other.

Ink supply assembly 910 supplies ink to printhead assembly 902 and includes a reservoir 912 for storing ink. As such, in one example, ink flows from reservoir 912 to printhead assembly 902. In one example, printhead assembly 902 and ink supply assembly 910 are housed together in an inkjet or fluid-jet print cartridge or pen. In another example, ink supply assembly 910 is separate from printhead assembly 902 and supplies ink to printhead assembly 902 through an interface connection 913, such as a supply tube and/or valve.

Carriage assembly 916 positions printhead assembly 902 relative to print media transport assembly 918, and print media transport assembly 918 positions print media 924 relative to printhead assembly 902. Thus, a print zone 926 is defined adjacent to nozzles 608 in an area between printhead assembly 902 and print media 924. In one example, printhead assembly 902 is a scanning type printhead assembly such that carriage assembly 916 moves printhead assembly 902 relative to print media transport assembly 918. In another example, printhead assembly 902 is a non-scanning type printhead assembly such that carriage assembly 916 fixes printhead assembly 902 at a prescribed position relative to print media transport assembly 918.

Service station assembly 904 provides for spitting, wiping, capping, and/or priming of printhead assembly 902 to maintain the functionality of printhead assembly 902 and, more specifically, nozzles 608. For example, service station assembly 904 may include a rubber blade or wiper which is periodically passed over printhead assembly 902 to wipe and clean nozzles 608 of excess ink. In addition, service station assembly 904 may include a cap that covers printhead assembly 902 to protect nozzles 608 from drying out during periods of non-use. In addition, service station assembly 904 may include a spittoon into which printhead assembly 902 ejects ink during spits to ensure that reservoir 912 maintains an appropriate level of pressure and fluidity, and to ensure that nozzles 608 do not clog or weep. Functions of service station assembly 904 may include relative motion between service station assembly 904 and printhead assembly 902.

Electronic controller 920 communicates with printhead assembly 902 through a communication path 903, service station assembly 904 through a communication path 905, carriage assembly 916 through a communication path 917, and print media transport assembly 918 through a communication path 919. In one example, when printhead assembly 902 is mounted in carriage assembly 916, electronic controller 920 and printhead assembly 902 may communicate via carriage assembly 916 through a communication path 901. Electronic controller 920 may also communicate with ink supply assembly 910 such that, in one implementation, a new (or used) ink supply may be detected.

Electronic controller 920 receives data 928 from a host system, such as a computer, and may include memory for temporarily storing data 928. Data 928 may be sent to fluid ejection system 900 along an electronic, infrared, optical or other information transfer path. Data 928 represent, for example, a document and/or file to be printed. As such, data 928 form a print job for fluid ejection system 900 and includes at least one print job command and/or command parameter.

In one example, electronic controller 920 provides control of printhead assembly 902 including timing control for ejection of ink drops from nozzles 608. As such, electronic controller 920 defines a pattern of ejected ink drops which form characters, symbols, and/or other graphics or images on print media 924. Timing control and, therefore, the pattern of ejected ink drops, is determined by the print job commands and/or command parameters. In one example, logic and drive circuitry forming a portion of electronic controller 920 is located on printhead assembly 902. In another example, logic and drive circuitry forming a portion of electronic controller 920 is located off printhead assembly 902.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. An integrated circuit for a fluid ejection device, the integrated circuit comprising:
   a status register;
   a plurality of interfaces comprising a mode interface, a fire interface, and a data interface; and
   control logic to enable reading of the status register in response to both a signal on a single mode interface transitioning to logic high with a logic high signal on the single data interface and transitioning a signal on the fire interface to logic high with the signal on the single data interface floating,
   wherein the single data interface is to input data to the integrated circuit and output data from the integrated circuit.

2. The integrated circuit of claim 1, wherein the control logic is to disable reading of the status register in response to a logic low signal on the single mode interface.

3. The integrated circuit of claim 1, wherein the control logic is to disable reading of the status register in response to a logic low signal on the fire interface.

4. The integrated circuit of claim 1, wherein the status register is to output serial data to the single data interface with the status register enabled for reading.

5. The integrated circuit of claim 1, wherein the plurality of interfaces comprises a clock interface, and
   wherein the status register is to output serial data to the single data interface aligned with a clock signal on the clock interface.

6. The integrated circuit of claim 1, wherein the integrated circuit is a fluid ejection die.

7. The integrated circuit of claim 1, wherein the control logic is to disable writing to the configuration register in response to a logic low signal on the single mode interface.

8. The integrated circuit of claim 1, wherein the configuration register is to receive serial data from the single data interface with the configuration register enabled for writing.

9. The integrated circuit of claim 8, wherein the plurality of interfaces includes a clock interface, and
   wherein the configuration register is to receive the serial data from the single data interface aligned with a clock signal from the clock interface.

10. A method for accessing a fluid ejection die, the method comprising:
    setting a signal on a single data contact pad of the fluid ejection die to logic high;
    transitioning a signal on a single mode contact pad of the fluid ejection die to logic high;
    floating the signal on the single data contact pad with the signal on the single mode contact pad logic high;
    transitioning a signal on a fire contact pad of the fluid ejection die to logic high with the signal on the single data contact pad floating; and
    enabling reading of a status register of the fluid ejection die in response to transitioning the signal on the fire contact pad to logic high with the signal on the single data contact pad floating.

11. The method of claim 10, further comprising:
    transitioning the signal on the mode contact pad to logic low; and
    disabling reading of the status register in response to the logic low signal on the mode contact pad.

12. The method of claim 10, further comprising:
    transitioning the signal on the fire contact pad to logic low; and
    disabling reading of the status register in response to the logic low signal on the fire contact pad.

13. The method of claim 10, further comprising:
    with the status register enabled for reading, outputting serial data from the status register to the data contact pad.

14. The method of claim 13, further comprising:
    with the status register enabled for reading, outputting serial data from the status register to the data contact pad aligned with a clock signal on a clock signal pad of the fluid ejection die.

15. The method of claim 10, further comprising:
    transitioning the signal on the single mode interface to logic high with a logic high signal on the single data interface during the single mode interface transition from logic low to logic high;
    transitioning the signal on the fire interface to logic low; and
    enabling writing to a configuration register of the fluid ejection die in response to transitioning the signal on the fire interface to logic low.

16. The method of claim 15, further comprising:
    disabling writing to the configuration register in response to a logic low signal on the single mode interface.

17. The method of claim 15, further comprising:
    receiving serial data at the configuration register from the single data interface with the configuration register enabled for writing.

18. The method of claim 17, further comprising:
    receiving a clock signal at a clock interface of the fluid ejection device.

19. The method of claim 18, wherein the serial data is received at the configuration register aligned with the clock signal.

* * * * *